United States Patent [19]

Boudewijns

[11] Patent Number: 4,812,887
[45] Date of Patent: Mar. 14, 1989

[54] CHARGE-COUPLED DEVICE

[75] Inventor: Arnoldus J. J. Boudewijns, Eindhoven, Netherlands

[73] Assignee: U. S. Philips Corporation, New York, N.Y.

[21] Appl. No.: 165,429

[22] Filed: Mar. 1, 1988

Related U.S. Application Data

[63] Continuation of Ser. No. 21,562, Mar. 3, 1987, abandoned, which is a continuation of Ser. No. 785,422, Oct. 8, 1985, abandoned.

[30] Foreign Application Priority Data

Oct. 12, 1984 [NL] Netherlands ................... 8403113

[51] Int. Cl.[4] ...................... H01L 29/78; G11C 19/28
[52] U.S. Cl. ........................................ 357/24; 377/58
[58] Field of Search ................. 357/24; 377/57–63

[56] References Cited

U.S. PATENT DOCUMENTS

| | | | |
|---|---|---|---|
| 3,856,989 | 12/1974 | Weimer | 357/24 LR |
| 3,965,481 | 6/1976 | Esser | 357/24 M |
| 4,028,716 | 6/1977 | van Santen et al. | 357/24 LR |
| 4,040,076 | 8/1977 | Kosonocky et al. | 357/24 LR |
| 4,362,575 | 12/1982 | Wallace | 357/24 M |
| 4,396,438 | 8/1983 | Goodman | 357/24 M |
| 4,667,213 | 5/1987 | Kosonocky | 357/24 M |

OTHER PUBLICATIONS

Howes et al, Eds., Charge-coupled Devices and Systems, Wiley, N.Y. 1979, pp. 252–255.

Primary Examiner—Gene M. Munson
Attorney, Agent, or Firm—Steven R. Biren

[57] ABSTRACT

The invention relates to a charge-coupled device with bulk transport (PCCD or BCCD), in which the lateral boundary is formed by zones (6) of the same type as and having a lower concentration than the charge transport channel. The potential barriers necessary for the lateral bounding are induced in these channel-bounding zones via the clock electrodes (7) of the CCD. As compared with conventional CCD's with bulk transport, in which the lateral boundary comprises a cut-off pn junction, a CCD of the type suggested here has the important advantage of low dynamic leakage currents.

3 Claims, 1 Drawing Sheet

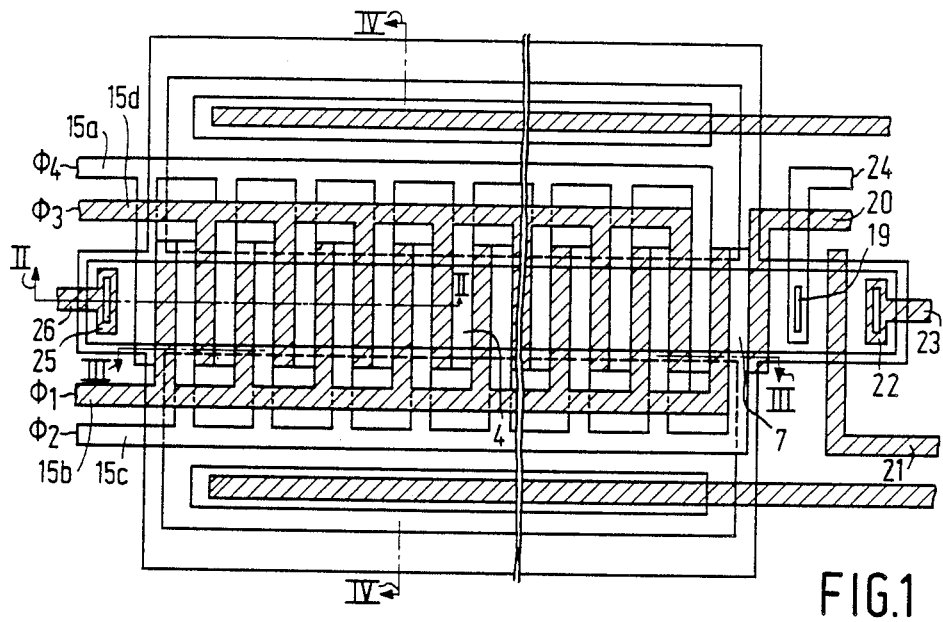
FIG.1
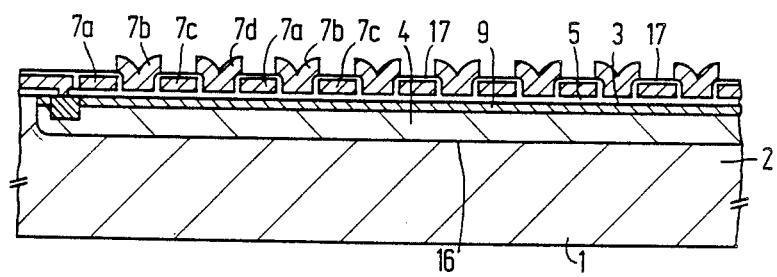
FIG.2
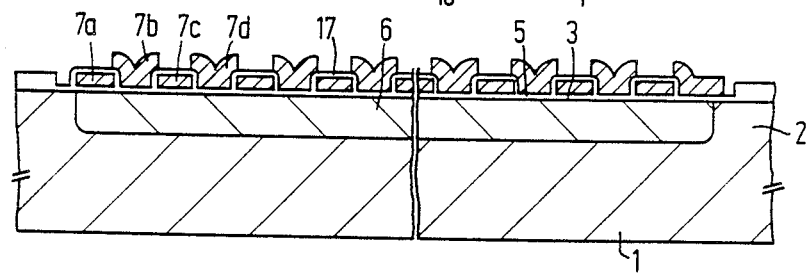
FIG.3
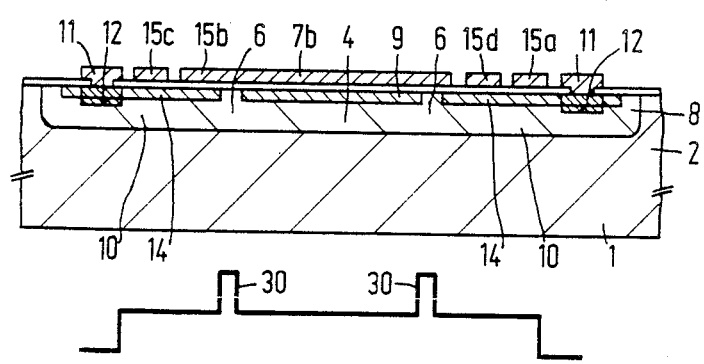
FIG.4
FIG.4a

CHARGE-COUPLED DEVICE

This is a continuation of application Ser. No. 021,562, filed Mar. 3, 1987, which was a continuation of Ser. No. 785,422, filed Oct. 8, 1985, both now abandoned.

BACKGROUND OF THE INVENTION

The invention relates to a charge-coupled device of the buried channel type comprising a semiconductor body having a layer-shaped region which adjoins a surface and in which a charge transport channel is defined in the form of a surface region of the first conductivity type, which on the upper side adjoins an insulating layer and on the lower side adjoins a semiconductor region of the second conductivity type, which forms with the charge transport channel a pn junction and is bounded at its sides by channel-bounding zones, while a row of clock electrodes extending transversely throughout the width of the charge transport channel is present on the insulating layer. Charge-coupled devices of the buried channel type are generally known in literature under the designation "BCCD" (Buried Channel CCD) or PCCD (Peristaltic CCD). The charge transport channel has a surface layer which is so thin that with the given doping concentration a depletion region can be formed throughout its thickness without breakdown. This depletion region is induced partly from the surface by a suitable voltage at the electrodes and partly from the lower side of the charge transport channel by biassing the pn junction between the charge transport channel and the semiconductor body in the reverse direction.

In conventional devices, the lateral boundary of the charge transport channel comprises a cut-off pn junction. When the charge transport channel is constituted by a zone of the one conductivity type which is obtained by local redoping, for example by ion implantation, of a semiconductor body of the opposite conductivity type, this pn junction is obtained automatically and is formed by the upright walls of the implanted zone. When the charge transport channel is provided in an epitaxial layer of the one conductivity type deposited on a semiconductor substrate of the opposite conductivity type, the lateral boundary can be formed by zones of the opposite conductivity type which are diffused into the epitaxial layer and extend over at least part of the thickness of the epitaxial layer in this layer and form with it a pn junction which during operation is biased in the reverse direction.

Experiments have shown that the quality of the charge-coupled device described above can be adversely affected by leakage currents. It has been found more particularly that, while the leakage currents in the stationary condition (in which a DC voltage is applied to the clock electrodes) can be very low, sometimes very high leakage currents can occur when alternating voltages are applied to the clock electrodes. The physical cause of this phenomenon cannot be clearly accounted for.

SUMMARY OF THE INVENTION

The present invention has inter alia for its object to provide a charge-coupled device of the buried channel type in which the leakage currents described above and only occurring upon application of alternating voltages do not or substantially do not occur.

As already indicated above, it may be necessary in special cases to carry out additional processing steps for providing the channel-bounding zones, for example when the device is formed in an epitaxial layer, in which zones of the opposite conductivity type are formed for defining the charge transport channel.

The invention further has for its object to provide a charge-coupled device of the buried channel type, which can be manufactured in a simple manner.

According to the invention, a charge-coupled device of the kind mentioned above is characterized in that the channel-bounding zones are constituted by layer-shaped regions of the same conductivity type as and having per unit surface area a lower doping concentration than the charge transport channel and in that the clock electrodes and the insulating layer extend as far as above at least a part of the channel-bounding zones, the insulation zone having above the channel-bounding zones at least substantially the same thickness as above the charge transport channel.

Although the physical basis for the invention is not clear, it has surprisingly been found that the said large leakage currents do not occur or substantially do not occur any longer when the pn channel boundary is replaced by an electrically induced potential barrier. This barrier can be obtained by applying suitable voltages to the clock electrodes, which extend as far as above the more weakly doped region.

The charge-coupled device according to the invention can be manufactured in a simple manner because no additional steps are required for providing the channel-bounding zone.

BRIEF DESCRIPTION OF THE DRAWING

The invention will be described more fully with reference to an embodiment and the accompanying diagrammatic drawing, in which :

FIG. 1 is a plan view of a CCD according to the invention;

FIG. 2 shows a sectional view of this device taken on the line II—II in FIG. 1;

FIG. 3 shows a sectional view of the device taken on the line III—III in FIG. 1;

FIG. 4 shows a sectional view of the same device taken on the line IV—IV in FIG. 1;

FIG. 4a shows a potential distribution which is obtained during operation along the line IV—IV.

DESCRIPTION OF THE PREFERRED EMBODIMENT

The charge-coupled device shown in FIGS. 1 to 4 comprises a semiconductor body 1, which in this case comprises silicon, but, as may be clear to those skilled in the art, may be of another suitable semiconductor material. The semiconductor body 1 has a layer shaped region 2 which adjoins a surface 3 and in which the charge transport channel 4 is defined. In the present embodiment, the layer-shaped region 2 occupies the whole uniformly doped p-type semiconductor body 1. However, the region 2 may alternatively form only a sublayer of the semiconductor body 1 and may pass, for example, on the lower side into an n-type sublayer. The charge transport channel is provided in the form of an n-type surface region 4 which is obtained by locally redoping the p-type layer-shaped region 2, for example by means of ion implantation. As is generally known, for the channel 4 a thickness and a doping concentration are chosen which are so low that during operation a depletion layer can be formed throughout the thickness of the n-type channel 4, while avoiding breakdown.

The charge transport channel is bounded on the upper side in the usual manner by a thin insulating layer 5 of silicon oxide or another suitable material which forms the gate dielectric on which the clock electrodes 7 are provided. The charge transport channel is bounded on the lower side by the pn junction 16 between the p-type region 2 and the n-type charge transport channel 4 and this pn junction can be biased in the reverse direction during operation.

The charge transport channel 4 is bounded on both sides by channel-bounding zones constituted by layer-shaped n-type regions 6 and therefore by regions of the same conductivity type as the charge transport layer and having per unit surface area a lower doping concentration than the charge transport channel. As can be seen in the sectional views of FIG. 3 and FIG. 4, the thin oxide layer 5 extends not only above the channel 4, but also above the channel-bounding zones 6.

A conventional clock electrode system 7 is provided on the insulating layer 5. In the present embodiment, for this purpose a 4-phase system is used comprising the clock electrodes 7a belonging to the first phase, the clock electrodes 7b belonging to the second phase, the clock electrodes 7c belonging to the third phase and the clock electrodes 7d belonging to the fourth phase. Instead of a 4-phase system, also any other known clock phase system, for example a 3-phase or 2-phase system, may be used. The clock electrodes also extend as far as above the bounding zones 6 and induce in situ due to the concentration difference with the charge transport channel 4 potential barriers which laterally bound the charge transport in the charge transport channel 4. Cut-off pn junctions, which are used for lateral bounding in conventional charge-coupled devices of the buried channel type are avoided in the charge-coupled device according to the invention. Experiments have shown that large leakage currents, which may occur in conventional channel boundings when during operation clock voltages are applied to the clock electrodes are thus also avoided.

The charge transport channel 4 and the channel-bounding zones 6 can be constituted by two separately provided adjoining zones of the same conductivity type, but having different doping concentrations. However, in the embodiment described here, the charge transport channel 4 and the channel-bounding zones 6 both form part of a common layer-shaped n-type surface region 8, which is provided at the area of the charge transport channel 4 with a thin more highly doped surface zones 9, which is also of the n-type and has a higher doping concentration than the bulk of the surface region 8. The surface region is constituted in this case by an implanted region, but may of course also consist of a part of an n-type epitaxial layer deposited on a p-type substrate.

As can be seen inter alia in FIG. 4, the surface region 8 comprises besides the part enclosed by the bounding zones 6 a further part 10, which is located between the outer edge of the region 8 and the bounding zones 6. This part is provided with a contact 11, which is connected to the part 10 via the highly doped n+ zone 12. By means of this contact, during operation a positive voltage can be applied and electrons, which during operation are generated in the region 10 and in the the channel-bounding zones 6, can be discharged. In the region between the channel-bounding zones 6 and the n+ contact zones, a more highly doped surface zone 14 of the same thickness and doping concentration as the zone 9 may advantageously be provided.

The clock voltages are supplied to the clock electrodes 7a, b, c and d via the clock lines 15a, b, c and d, which are connected to the clock electrodes 7a, 7b 7c and 7d, respectively, and are also located above the n-type region 10, 14 and are separated therefrom by the oxide layer 5.

The charge-coupled device further comprises a conventional output with a more highly doped n+ zone 19, which is connected to a connection conductor 24, through which the signal to be read out can be supplied to an amplifier. There is provided between the zone 19 and the last clock electrode 7 an output gate 20 which can be applied to a suitably chosen fixed potential. The zone 19 is connected to a reset transistor, whose source is constituted by the zone 19, whose gate is constituted by the conductor 21 and whose drain is constituted by the n+ zone 22 which is connected to the conductor 23. The device further has a conventional input with an n+ input zone 25, which is connected to the conductor 26, through which electrical signals can be supplied.

The starting material for the manufacture of the device is a p-type semiconductor body of silicon having a thickness of about 250 μm and a doping concentration of about $5 \cdot 10^{14}$ atoms/cm$^3$. The region 8 is provided by means of implantation of phosphorus ions at a doping concentration of about $7 \cdot 10^{14}$ atoms/cm$^3$.

The zones 9 and 14 may also be formed by means of implantation of phosphorus ions and have a thickness of about 0.2 to 0.3 μm and a doping concentration of $10^{12}$ atoms/cm$^2$. The contact zones 12 can be manufactured in the usual manner.

The oxide layer 5 has a thickness of about 1000 Å (=0.1 μm). The electrodes 7a and 7c are provided together with the associated clock lines 15a and 15c in a first metallization layer, more particularly a first layer of polycrystalline silicon. After these clock electrodes and the associated clock lines have been patterned by etching, an oxide layer 17 is formed in a usual manner on the polycrystalline silicon. Subsequently, the clock electrodes 7b and 7d and the associated clock lines 15b and 15d are formed in a second metallization layer of, for example, A1. At the same time, the contacts 11 can be formed. Thereafter, the device can be subjected to further usual processing steps, such as growing a thick passivation layer and providing the device in a suitable envelope.

During operation, such a voltage is applied to the charge transport channel 4 that the pn junction 16 between the substrate 1 and the charge transport channel 4 is biased in the reverse direction, as a result of which the n-type zone 4 is depleted from the substrate side over at least part of its thickness. Furthermore, the clock electrodes are negatively biased with respect to the layer 4 so that the layer 4 is also depleted from the upper side. The charge transport channel 4, which is then ready for operation, has for electrons a potential minimum which, depending upon the voltages applied, is located at a certain distance from the surface 3. Such a potential minimum is also obtained in the channel-bounding zones 6. Starting from the equation of Poisson, it can be recognized that due to the lower doping in the channel-bounding zones 6 the potential minimum is less deep than in the charge transport channel 4.

In order to illustrate this, in FIG. 4a there is indicated diagrammatically below FIG. 4 the potential profile which during operation will be obtained between the contacts 11, 12 in the n-type region. Due to the equal doping concentrations, the potential in the region 10, 14 will have approximately the same value as the potential in the charge transport channel 4. The electrons are laterally bounded in the channel by potential barriers 30, which are generated by the electrodes in the more weakly doped n-type regions 6. For electrons stored and transported in the charge transport channel 4, the potential in the zones 6 therefore forms a barrier which encloses the electrons in the charge transport channel 4. Thus, an effective channel-bounding zone can be obtained without pn junctions near the clock electrodes.

Experiments have shown that in devices of the type described here, when voltages were applied to the electrodes 7 the leakage currents substantially did not increase as compared with devices in which, as usual, the channel boundary comprises a cut-off pn junction extending as far as below the clock electrodes.

In the n-type region 10 outside the channel-bounding zones 6 a potential minimum is formed which is again lower than the potential in the regions 6, by applying a sufficiently high voltage via the contact 11. Electrons generated in this region will not pass the potential barrier in the channel-bounding zone 6 to the charge transport channel 4, but can be discharged via the contact 11, 12.

When charge carriers are generated, holes can also be formed both in the charge transport channel 4 and in the channel-bounding zones 6. A part of these holes can be discharged directly via the substrate 1. However, another part can be stored at the surface in the channel-bounding zones 6. In the same manner as the electrons in the charge transport channel 4, these holes can be moved through the channel-bounding zones 6 parallel to and shifted through 180° with respect to the electrons in the charge transport channel 4 in packets in a manner usual for CCD's under the influence of the clock voltages which are applied to the electrodes 7. When the n-type surface region 8 is proportioned so that the last (or first) clock electrode in the row 7 overlaps the p-type substrate 1 (cf. FIG. 3), the holes present in the channel-bounding zones can be transported in a simple manner to the p-type substrate 1 below the last clock electrode and can be discharged in situ.

It will be appreciated that the invention is not limited to the embodiment described herein, but that many further variations are possible for those skilled in the art without departing from the scope of the invention. For example, the device may also have two or more parallel channels, which are mutually separated at least along part of their lengths by an intermediate channel-bounding zone of the same conductivity type as the charge transport channels and having a lower doping concentration.

In the embodiment described, the conductivity types can be inverted.

What is claimed is:

1. A charge-coupled device of the buried channel type comprising a semiconductor body with a major surface and having a layer-shaped region which adjoins said surface, a charge transport channel in the form of a surface region of the first conductivity type in said layer-shaped region, an insulating layer on the upper side of said surface region, a semiconductor region of the second conductivity type on the lower side of said surface region which forms a pn junction with the charge transport channel, channel-bounding zones for bounding said surface region at its sides, a row of clock electrodes extending transversely throughout the width of the charge transport channel and on the insulating layer, and an input stage having an input zone of the first conductivity type and a supply conductor for supplying electrical signals thereto, further comprising means for substantially eliminating AC leakage currents during operation, said means including said channel-bounding zones which comprise layer-shaped regions of the same conductivity type as and having a lower doped concentration per unit surface area than the charge transport channel, the clock electrodes and the insulating layer extending above at least a part of the channel-bounding zones, the insulating layer having at least substantially the same thickness above the channel-bounding zones as above the charge transport channel and said channel-bounding zones having at least substantially the same thickness as that of said charge transport channel, and means for draining charge from said channel-bounding zones during operation and comprising highly-doped thin surface zones of said first conductivity type located alongside said channel-bounding zones and having at least one electrical connection, portions of said clock electrodes and said insulating layer extending above at least a part of said highly-doped thin surface zones.

2. A charge-coupled device as claimed in claim 1, characterized in that the charge transport channel and the channel-bounding zones both form part of a layer-shaped surface region of the first conductivity type, which is provided at the area of the charge transport channel with a surface zone of the first conductivity type which has a higher doping concentration than that of said layer-shaped surface region.

3. A charge-coupled device as claimed in claim 2, characterized in that the clock electrodes are connected to clock lines, which are also provided above the layer-shaped region of the first conductivity type and are separated therefrom by said insulating layer.

* * * * *